United States Patent
Inao et al.

(10) Patent No.: US 7,808,096 B2
(45) Date of Patent: Oct. 5, 2010

(54) SEMICONDUCTOR PACKAGE AND PRODUCTION METHOD THEREOF, AND SEMICONDUCTOR DEVICE

(75) Inventors: Hisaho Inao, Niigata (JP); Tatsuya Hirano, Niigata (JP); Katsutoshi Shimizu, Kyoto (JP)

(73) Assignee: Panasonic Corporation, Osaka (JP)

( * ) Notice: Subject to any disclaimer, the term of this patent is extended or adjusted under 35 U.S.C. 154(b) by 649 days.

(21) Appl. No.: 11/659,468

(22) PCT Filed: May 12, 2005

(86) PCT No.: PCT/JP2005/008697

§ 371 (c)(1),
(2), (4) Date: Aug. 27, 2007

(87) PCT Pub. No.: WO2006/013664

PCT Pub. Date: Feb. 9, 2006

(65) Prior Publication Data

US 2008/0132002 A1    Jun. 5, 2008

(30) Foreign Application Priority Data

Aug. 6, 2004    (JP) ............................ 2004-230712

(51) Int. Cl.
*H01L 23/48*    (2006.01)
*H01L 23/52*    (2006.01)
(52) U.S. Cl. ...................... 257/692; 257/730; 257/787; 257/E23.043; 257/E23.049; 257/E23.066
(58) Field of Classification Search ................ 257/666, 257/676, 690, 692, 693, 696, 730, 787, 790, 257/E23.004, E23.043, E23.046, E23.048, 257/E23.049, E23.05, E23.066, E23.184, 257/E23.189
See application file for complete search history.

(56) References Cited

U.S. PATENT DOCUMENTS 6,696,753 B2 *    2/2004    Tokuhara ................. 257/692

(Continued)

FOREIGN PATENT DOCUMENTS

JP    06-120375    4/1994

(Continued)

OTHER PUBLICATIONS

Japanese Office Action, with English translation, issued in Japanese Patent Application No. 2004-230712, mailed Nov. 24, 2009.

*Primary Examiner*—Davienne Monbleau
*Assistant Examiner*—Dilinh P Nguyen
(74) *Attorney, Agent, or Firm*—McDermott Will & Emery LLP

(57) ABSTRACT

A semiconductor package production method includes the step of die-cutting part of a lead side portion of a seal formed by molding and dam bars using a pedestal and punch. The pedestal has an outer surface at a position retreating from a side surface of an upper seal portion as far as possible and an inner surface generally near a side surface of a lower seal portion. Width Wa of the upper surface of the upper surface of the pedestal is smaller than the overhang size of the upper seal portion. Tip end region Ra of the lead side portion which is present right under the overhang portion of the upper seal portion has a slanted surface Fa1 which is sloped inwardly from top to bottom.

6 Claims, 13 Drawing Sheets

U.S. PATENT DOCUMENTS

2004/0212049 A1 * 10/2004 Fukatani et al. ............. 257/666

FOREIGN PATENT DOCUMENTS

| JP | 7-22542 | 1/1995 |
| JP | 7-193095 | 7/1995 |
| JP | 2002-94035 | 3/2002 |
| JP | 2003-17643 | 1/2003 |

* cited by examiner

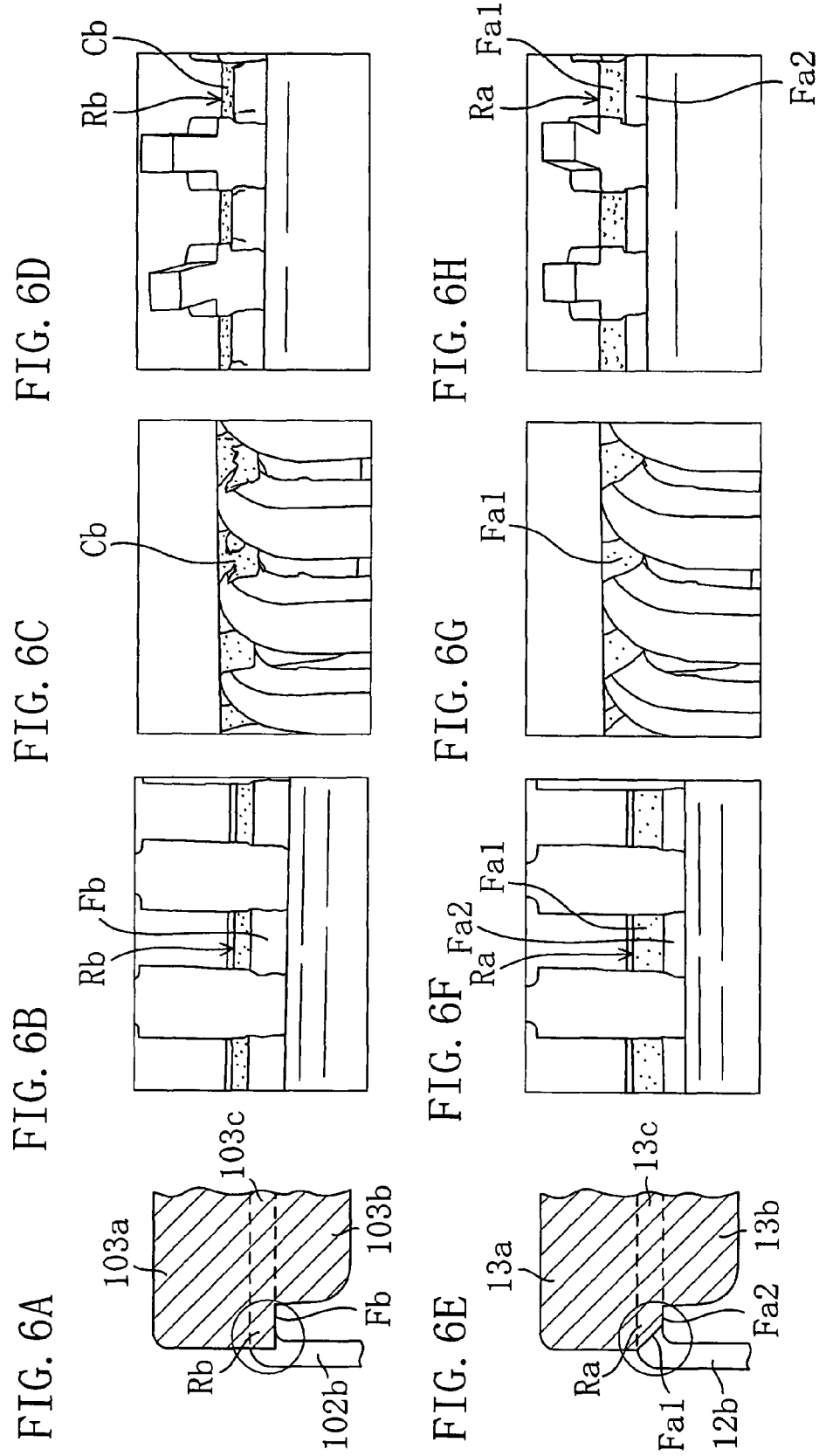

SEMICONDUCTOR PACKAGE AND PRODUCTION METHOD THEREOF, AND SEMICONDUCTOR DEVICE

RELATED APPLICATIONS

This application is the U.S. National Phase under 35 U.S.C. §371 of International Application No. PCT/JP2005/008697, filed on May 12, 2005, which in turn claims the benefit of Japanese Application No. 2004-230712, filed on Aug. 6, 2004, the disclosures of which Applications are incorporated by reference herein.

TECHNICAL FIELD

The present invention relates to a semiconductor package formed of a resin or ceramic, to which an LSI chip, solid state imaging element, light-receiving/emitting element, or the like, is to be mounted, a production method thereof, and a semiconductor device.

BACKGROUND ART

Conventionally, the mold step for a semiconductor package has been carried out in such a manner that, in a region adjacent to a die cavity, a lead frame which has leads and dam bars connecting the leads is sandwiched between the lower die half and upper die half of the mold die, and a resin or ceramic is injected into the die cavity for molding.

In this process, as shown in FIG. 3 and FIG. 4 of patent Document 1, resin, or the like, remains between the dam bar and a seal. This is because, in the mold step, the dam bar is positioned outwardly away from the die cavity by a predetermined distance, so that the resin, or the like, leaks in a space surrounded by the upper and lower die halves of the mold die and the dam bar. After the completion of the mold step, the dam bars connecting the leads are cut in order to break the electrical connections between the leads. It has been known, however, that the residual resin (or ceramic) has small adhesivity to the leads and therefore readily falls off, thereby causing various defects.

For example, in patent Document 1, a dam bar is cut by using a resin cut die with an elastic element such that the residual resin is removed away together with the dam bar as shown in FIG. 2 of this publication.

According to a method illustrated in FIG. 1 of patent Document 2, a dam bar is cut with a side edge of a die part which supports a lead part present between the dam bar and a seal being positioned inner than a side edge of the lead, such that part of the residual resin remains. The remaining resin part is removed later by an elastic element, or the like.

Patent Document 1: Japanese Laid-Open Patent Publication No. 7-193095
Patent Document 2: Japanese Laid-Open Patent Publication No. 2003-17643

DISCLOSURE OF INVENTION

Problems to be Solved by the Invention

There are some semiconductor packages having a so-called overhang structure wherein part of a seal upper than a lead is larger than part of the seal lower than the lead.

FIG. 13 is a cross-sectional view showing the structure of an optical device which includes a semiconductor package having a conventional overhang structure. At the left end of FIG. 13, the structure of a cross-section through resin part between leads is shown. At the right end of FIG. 13, the structure of a cross-section through a lead is shown.

As shown in FIG. 13, the optical device includes an optical chip 101, such as a solid state imaging element, light-receiving/emitting element, LSI, or the like, a lead 102 for transmission/reception of a signal between the optical chip 101 and an external device, a metal wire 107 for connecting the semiconductor chip 101 and the lead 102, a rectangular seal 103 for sealing the lead 102, and a lid member 105 attached onto the upper surface of the seal 103, such as a glass window, hologram, ceramic lid, or the like. Part of the seal 103 around the lead 102 includes an upper seal portion 103a which is present on the upper surface side of the lead 102, a lower seal portion 103b which is present on the lower surface side of the lead 102, and a lead side portion 103c which is sandwiched between the upper seal portion 103a and the lower seal portion 103b to fill the gap between the leads. It should be noted, however, that there are no definite borders between the upper seal portion 103a, the lower seal portion 103b and the lead side portion 103c, and that the seal 103 is integrally formed of resin injected at the time of molding.

The lid member 105 is attached onto the upper surface of the upper seal portion 103a. The optical chip 101 is attached onto the central part of the lower seal portion 103b. That is, the structure is such that the optical chip 101 is placed in an internal space 106 surrounded by the upper seal portion 103a, the lower seal portion 103b, the lead side portion 103c and the glass window 105.

Herein, a region Rd of an outer lead 102b at the left end of FIG. 13 represents a portion from which a dam bar has been removed. Further, although not seen in FIG. 13 there is, immediately after the end of the mold step, a portion of the lead side portion 103c extending outward beyond the upper seal portion 103a (residual resin). Then, at the time of cutting the dam bar (partial die-cut step), part of the lead side portion 103c which is present immediately after the end of the mold step and laterally extending beyond the overhang portion of the upper seal portion 103a is removed together with the dam bar.

However, a tip region Rb of the lead side portion 103c which is present below the upper seal portion 103a remains unremoved, so that there is a possibility that the tip region Rb falls off when the lead 102 is bent. After the lead 102 is bent, various steps, including attaching the optical chip 101 onto the lower seal portion 103b, wire bonding, attaching the glass window 105, etc., are carried out. If during these steps debris falling from the tip region 103c enters the space 106 of the package, the debris causes a malfunction of the optical device. For example, if the debris adheres onto a light receiving surface of a solid state imaging element, it causes a local dropout in an image. If the debris adheres onto a light emitting surface or reflection mirror surface of a light emitting element, entry of laser light to a recording medium is interrupted. Also in the case of a semiconductor package incorporating a CPU or an LSI of a memory, adhesion of debris can cause deterioration in reliability.

An objective of the present invention is to suppress the fall-off of a mold material inner than a dam bar in an overhang-type semiconductor package and hence to provide a highly-reliable semiconductor package and production method thereof, and a semiconductor device.

Means for Solving the Problems

According to the first semiconductor package of the present invention, part of a seal which surrounds a lead includes a lower seal portion present under a lower surface of the lead, an upper seal portion present over an upper surface of the lead, part of the upper seal portion overhanging beyond the lower seal portion, and a lead side portion filling a gap between the leads; an outer surface of the lead side portion is slanted inwardly along a downward direction; and the width of a tip region of the lead side portion protruding from the lower seal portion is in the range of a 1/5 to 4/5 of an overhang size of the upper seal portion.

With the above features, when bending an outer lead, substantially no seal is present in a region of the lead side portion in which the outer lead is to be bent. Therefore, generation of debris is suppressed, and the reliability is improved.

According to the second semiconductor package of the present invention, part of a seal which surrounds a lead includes a lower seal portion present under a lower surface of the lead, an upper seal portion present over an upper surface of the lead, part of the upper seal portion overhanging beyond the lower seal portion, and a lead side portion filling a gap between the leads; an outer surface of the lead side portion is slanted inwardly along a downward direction; and a tip region of the lead side portion protruding from the lower seal portion is not in contact with a portion of the outer lead which is to be bent.

With these features also, the same effects as those of the first semiconductor package are obtained.

The first and second semiconductor devices of the present invention are each directed to a semiconductor device having a semiconductor chip and a semiconductor package for accommodating the semiconductor chip wherein the structure of the semiconductor package is equal to that of the first or second semiconductor package.

A semiconductor package production method of the present invention includes: forming a seal by molding, part of the seal which surrounds leads including a lower seal portion present under lower surfaces of the leads, an upper seal portion present over upper surfaces of the leads, part of the upper seal portion overhanging beyond the lower seal portion, and a lead side portion filling gaps between the leads; and thereafter, die-cutting the lead side portion using a pedestal with a blade edge width smaller than an overhang size of the upper seal portion, such that a tip region of the lead side portion extending from the lower seal portion has a width in the range of a 1/5 to 4/5 of an overhang size of the upper seal portion.

With the above method, the structure of the first or second semiconductor package is obtained.

For die-cutting, such a punch that an angle of a blade edge closer to the lead side portion of the seal is in the range of 95° to 120° is used, whereby the load imposed on the pedestal can be decreased, and breakage of the pedestal, or the like, can be prevented.

For die-cutting, such a pedestal that a blade edge has a comb teeth-like planar shape extending toward the dam bar in a portion which is not in contact with the lead side portion of the seal is used, whereby the strength of the pedestal is secured so that breakage of the pedestal can be prevented.

The second semiconductor package production method of the present invention includes molding a mold material around at least part of the plurality of leads between the distal and proximal ends which is closer to the distal end than the dam bar using a lower die half with a protrusion which has an outer surface in contact with the dam bar and an inner surface slanted outwardly from bottom to top and an upper die half which cooperates with the lower die half to sandwich the lead frame therebetween.

With this method also, the structure of the first or second semiconductor package is obtained.

Effects of the Invention

With a semiconductor package and production method thereof and a semiconductor device of the present invention, highly-reliable semiconductor package or semiconductor device with fewer defects caused by debris of a mold material is realized.

BRIEF DESCRIPTION OF DRAWINGS

FIG. 6(a) through FIG. 6(d) are, respectively, a partial cross-sectional view of a semiconductor package, a partial back view of the semiconductor package before lead bending, a partial perspective view of the semiconductor package after lead bending, and a partial back view of the semiconductor package after lead bending in the conventional production process. FIG. 6(e) through FIG. 6(h) are, respectively, a partial cross-sectional view of a semiconductor package, a partial back view of the semiconductor package before lead bending, a partial perspective view of the semiconductor package after lead bending, and a partial back view of the semiconductor package after lead bending in the production process of embodiment 1.

DESCRIPTION OF REFERENCE NUMERALS

Figure 1:
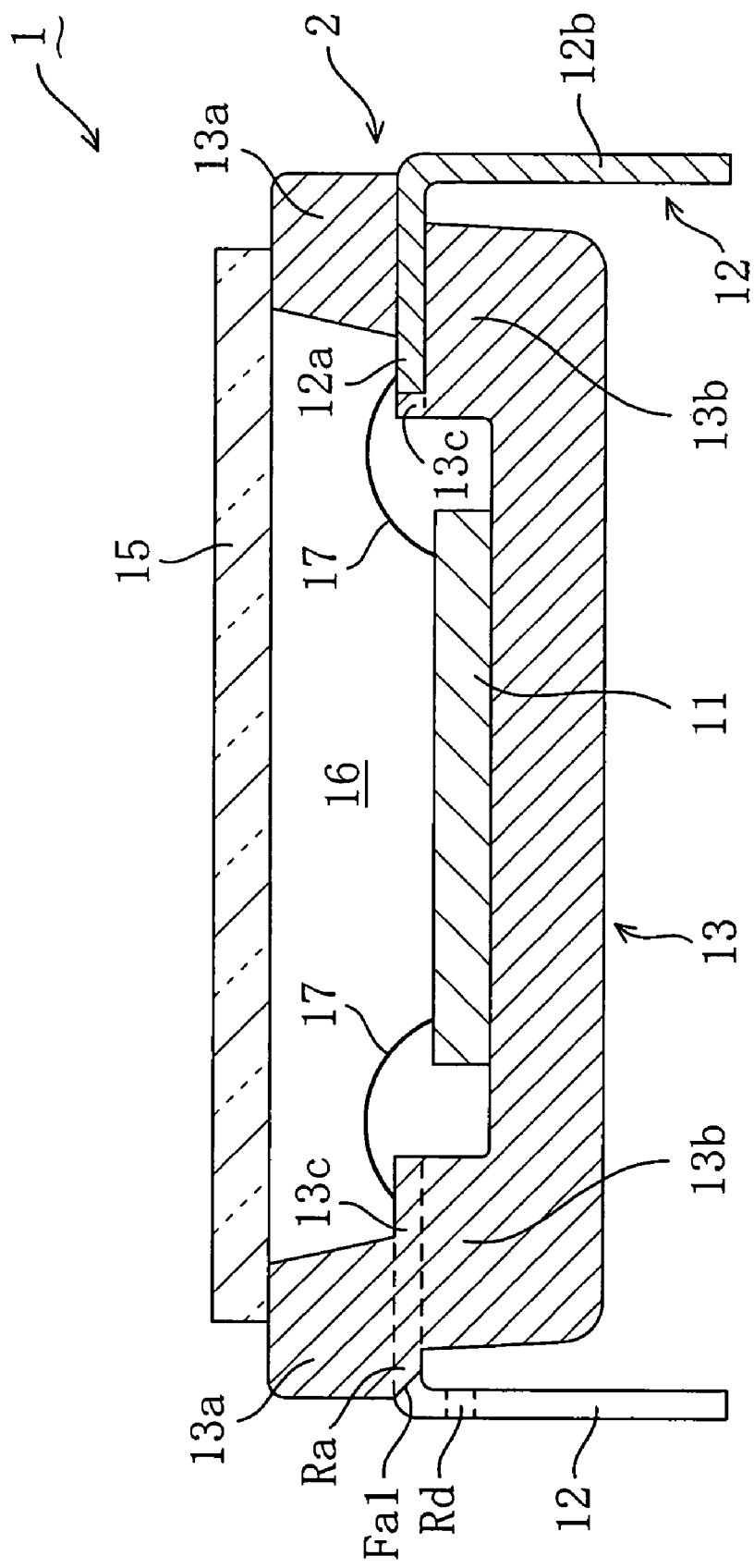
FIG. 1 is a cross-sectional view showing the structure of a semiconductor device according to embodiment 1 of the present invention.

1 Semiconductor device
2 Semiconductor package
11 Semiconductor chip
12 Lead
12a, 20a Inner lead
12b, 20b Outer lead
13 Seal
13a Upper seal portion
13b Lower seal portion
13c Lead side portion
15 Lid member
16 Internal space
17 Metal wire
20 Lead frame
20c Dam bar
30 Pedestal
30a Protrusion
30b Recess
31 Punch
32 Die
50 Lower die half
51 Dam block
51a Inner surface
51b Outer surface
52 Upper die half
55 Die cavity
Fa1 Slanted surface
Fa2 Lower surface
Ra Tip region

BEST MODE FOR CARRYING OUT THE INVENTION

Embodiment 1

FIG. 1 is a cross-sectional view showing the structure of a semiconductor device 1 according to embodiment 1 of the present invention. It should be noted that at the left end of FIG. 1, the structure of a cross-section through resin part between leads is shown, while at the right end of FIG. 1, the structure of a cross-section through a lead is shown. As shown in FIG. 1, the optical device 1 includes a semiconductor chip 11, such as a solid state imaging element, light-receiving/emitting element, LSI, or the like, a lead 12 for transmission/reception of a signal between the semiconductor chip 11 and an external device, a metal wire 17 for connecting the semiconductor chip 11 and the lead 12, a rectangular seal 13 for sealing the lead 12, and a lid member 15 attached onto the upper surface of the seal 13, such as a glass window, hologram, ceramic lid, or the like. Part of the seal 13 around the lead 12 (specifically, two side regions) includes an upper seal portion 13a which is present on the upper surface side of the lead 12, a lower seal portion 13b which is present on the lower surface side of the lead 12, and a lead side portion 13c which is sandwiched between the upper seal portion 13a and the lower seal portion 13b to fill the gap between the leads. It should be noted, however, that there are no definite borders between the upper seal portion 13a, the lower seal portion 13b and the lead side portion 13c, and that the seal 13 is integrally formed of resin injected at the time of molding. On a side where the lead 12 is not formed, no lead side portion exists, and it is not necessary to zone into an upper seal portion and a lower seal portion.

The lid member 15 is attached onto the upper surface of the upper seal portion 13a. The semiconductor chip 11 is attached onto the central part of the lower seal portion 13b. That is, the structure is such that the semiconductor chip 11 is placed in an internal space 16 surrounded by the upper seal portion 13a, the lower seal portion 13b and the lid member 15.

Part of the lead 12 which is sealed by the seal 13 and part of the lead 12 which is exposed inside the internal space 16 are referred to as an inner lead 12a, part of the lead 12 which extends outward beyond the seal 13 is referred to as an outer lead 12b.

In this embodiment, a semiconductor package 2 is formed by the lead 12, the upper seal portion 13a, the lower seal portion 13b and the lead side portion 13c. The semiconductor device 1 is formed by attaching the semiconductor chip 11, metal wires 17 and the lid member 15 to this semiconductor package 2.

Herein, a region Rd of the outer lead 12b at the left end of FIG. 1 represents a portion from which a dam bar has been removed. Further, although not seen in FIG. 1 there is, immediately after the end of the mold step, a portion of the lead side portion 13c extending outward beyond the upper seal portion 13a.

In this embodiment, as is different from conventional packages, as for the lead side portion 13c which is present immediately after the end of the mold step, not only the part of the lead side portion 13c laterally extending beyond the overhang portion of the upper seal portion 13a but also a portion of the part of the lead side portion 13c which exists right below the overhang portion of the upper seal portion 13a are removed together with the dam bar at the time of cutting the dam bar (partial die-cut step). As a result, the side surface of a tip region Ra of the lead side portion 13c is a slanted surface Fa1 which is greatly slanted inwardly from top to bottom.

Next, a semiconductor package production process according to an embodiment of the present invention wherein a resin mold is utilized is described.

Figure 2A:
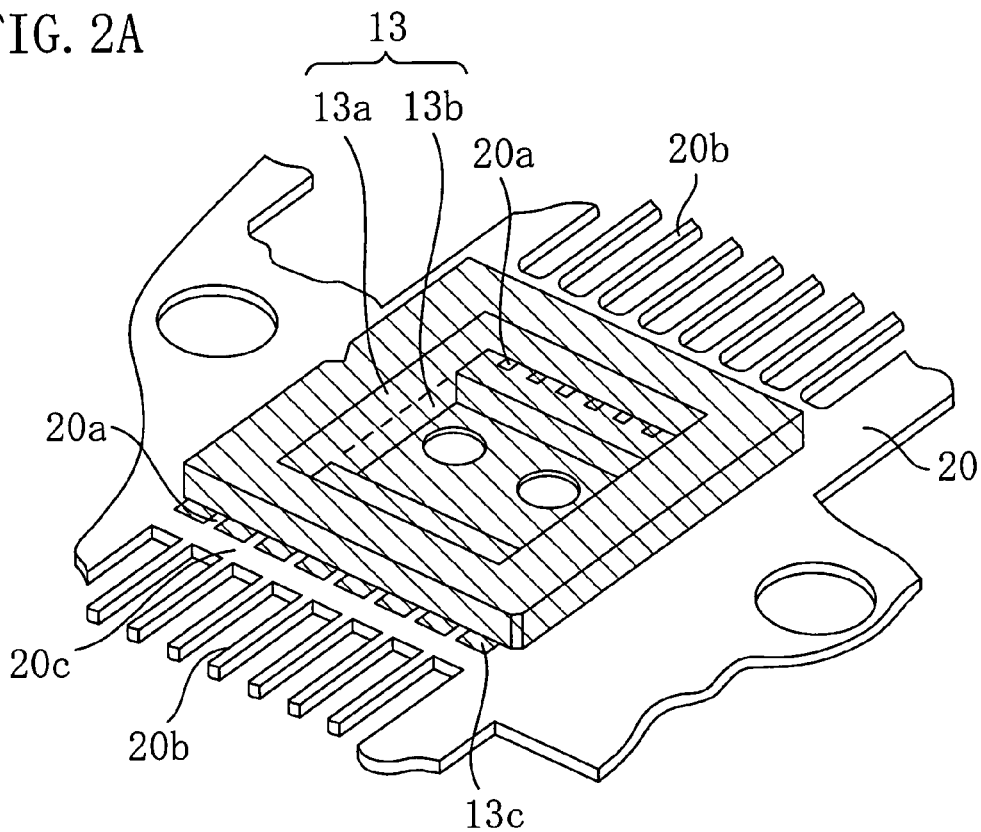
FIG. 2(a) and FIG. 2(b) are a perspective view and cross-sectional view showing the structure of a semiconductor package at the end of the mold step according to embodiment 1.
Figure 2B:
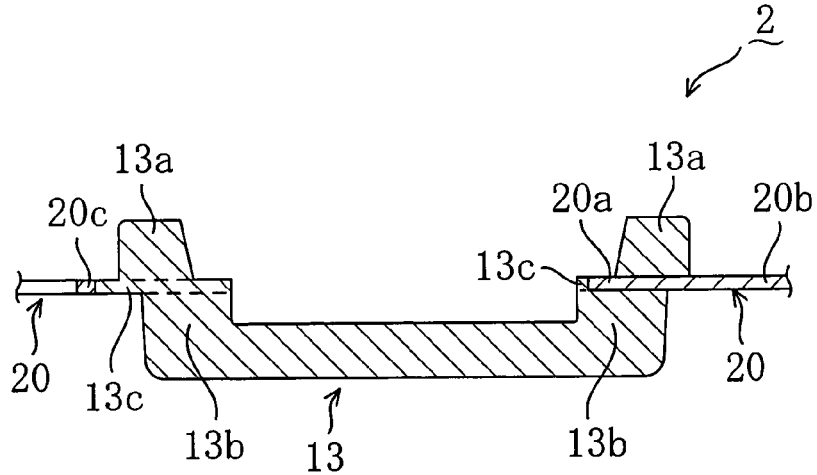

FIG. 2(a) and FIG. 2(b) are a perspective view and cross-sectional view showing the structure of a semiconductor package at the end of the mold step. The left end of FIG. 2(b) shows a cross-section through no lead, while the right end of FIG. 2(b) shows a cross-section through a lead. It should be noted that FIG. 2(a) and FIG. 2(b) are not drawn to the same scale. As shown in FIG. 2(a) and FIG. 2(b), a lead frame 20 is sealed between the upper seal portion 13a and the lower seal portion 13b which are formed of a mold resin. It should be noted that, as previously described, there is no definite border between the upper seal portion 13a and the lower seal portion 13b, and that the seal 13 is integrally formed of resin injected at the time of molding.

Part of the lead frame 20 inner than a dam bar 20c is referred to as an inner lead 20a, while part of the lead frame 20 outside the dam bar 20c is referred to as an outer lead 20b. The lead side portion 13c of the seal 13 exists between part of the inner lead 20a laterally extending from the lower seal portion 13b and the dam bar 20c. The lead frame 20 includes a large number of seal formation regions. In a region inner than the lower seal portion 13b, the upper surface of an end of the inner lead 20a is exposed, and wire bonding is performed on this exposed portion.

Figure 10C:
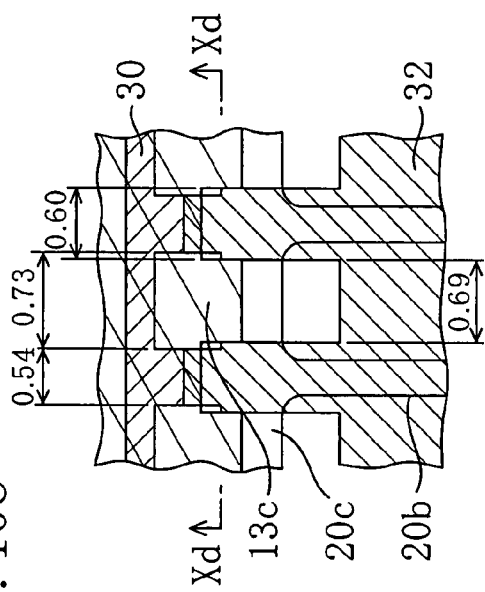
FIG. 10(c) and FIG. 10(d) are, respectively, a plan view illustrating the positional relationship between the pedestal and die and the seal which are used in the partial die cut step of embodiment 1, and a cross-sectional view taken along line Xd-Xd which illustrates the lead side portion falling.
Figure 10D:
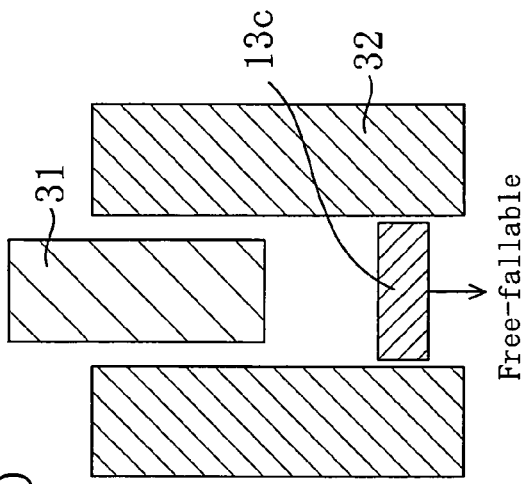

Then, the dam bar 20c and part of the lead side portion 13c are die-cut away from the structure shown in FIG. 2 (partial die-cut step). In this step, a pedestal 30, a punch 31 and a die 32 as shown in FIG. 10(b) and FIG. 10(c) are used.

Thereafter, wire bonding solely or wire bonding and attachment of the lid member are performed. Then, an end of the outer lead is separated from the main part of the lead frame, and the lead frame is cut along a side surface of the seal in which no lead is provided, such that each semiconductor package is separated from the lead frame (final die-cut step).

Figure 3A:
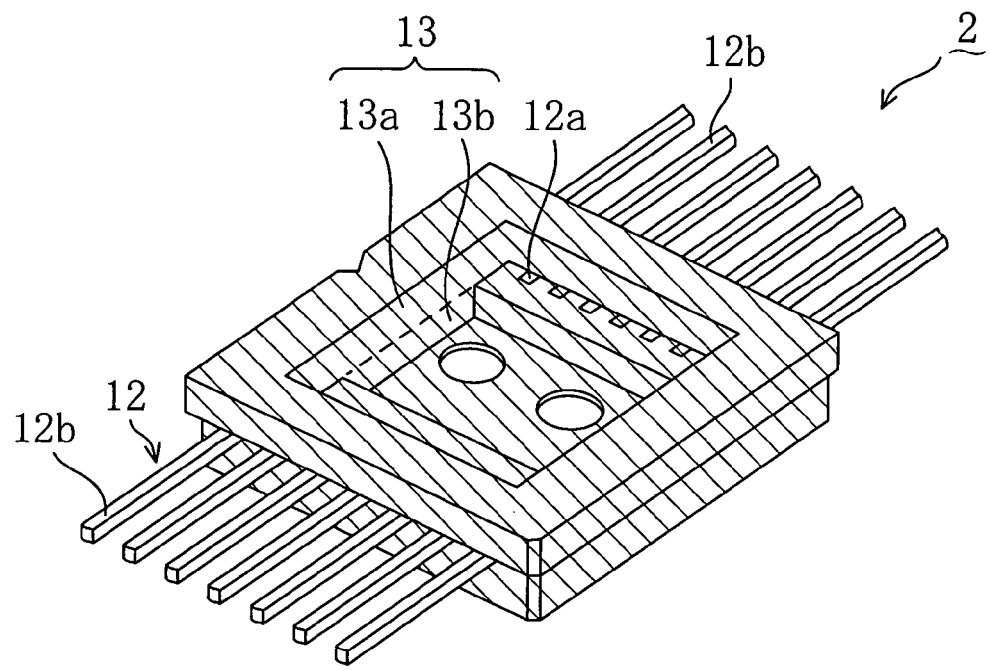
FIG. 3(a) and FIG. 3(b) are a perspective view and cross-sectional view of each of the semiconductor packages formed at the partial die-cut step according to embodiment 1.
Figure 3B:
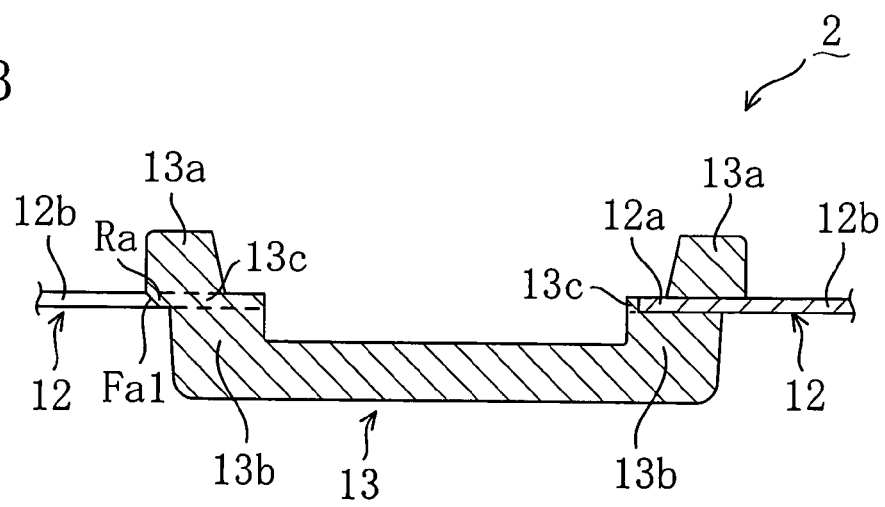

FIG. 3(a) and FIG. 3(b) are a perspective view and cross-sectional view of each of the semiconductor packages formed at the partial die-cut step. The left end of FIG. 3(b) shows a cross-section through no lead, while the right end of FIG. 3(b) shows a cross-section through a lead. It should be noted that FIG. 3(a) and FIG. 3(b) are not drawn to the same scale. In the partial die-cut step, the dam bar 20c and the lead side portion 13c are removed such that each lead is isolated from the others.

In each semiconductor package, part of the lead 12 buried in the seal 13 and part of the lead 12 present inner than the seal 13 are referred to as an inner lead 12a, and part of the lead 12 extending outward beyond the seal 13 is referred to as an outer lead 12b. That is, since there is no dam bar, the border between the outer lead 12b and the inner lead 12a is different from that in the lead frame. As will be described later, the lead side portion 13c of the lower seal portion 13b shown in FIG. 2(a) and FIG. 2(b) is obliquely sheared by the blade edge of the punch and the blade edge of the pedestal, whereby the part of the lead side portion 13c extending outward beyond the upper seal portion 13a and a portion of the part of the lead side portion 13c which exists right below the overhang portion of the upper seal portion 13a are removed. Therefore, the side surface of the tip region Ra of the lower seal portion 13b which is sandwiched between the outer leads 12b is a slanted surface Fa1 which is slanted inwardly from top to bottom.

Thereafter, the outer lead 12b is bent downward to have such a shape that the semiconductor package 2 is mountable to the mother board (lead bending step).

Figure 4:
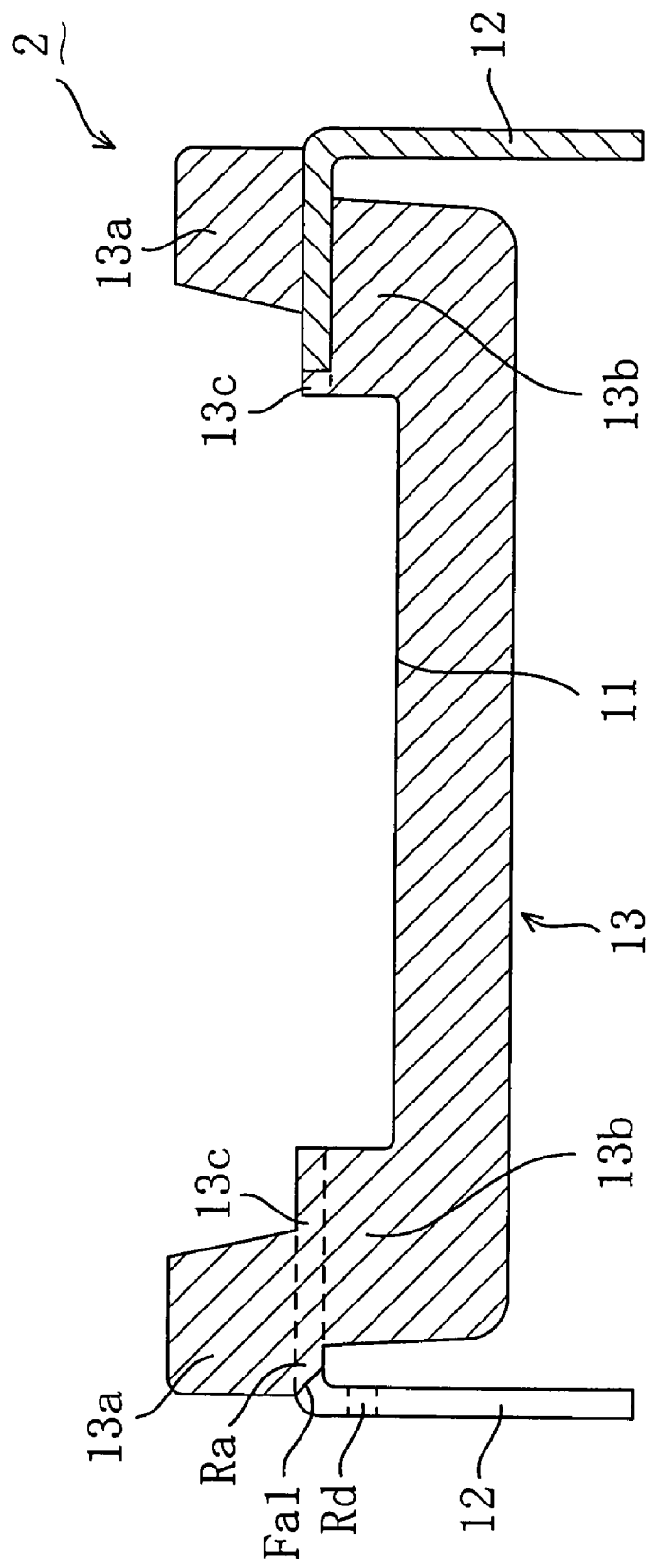
FIG. 4 is a cross-sectional view showing only a semiconductor package at the end of the lead bending step according to embodiment 1.

FIG. 4 is a cross-sectional view showing only a semiconductor package at the end of the lead bending step. The left end of FIG. 4 shows a cross-section through no lead, while the right end of FIG. 4 shows a cross-section through a lead.

At this point, in this embodiment, as will be described later, the width of the pedestal is adjusted such that the tip region Ra of the lower seal portion 13b, which is part of the lead side portion, is obliquely sheared between the outer leads 12b. Since substantially no part of the lead side portion exists around the bent portions of the outer leads 12b, generation of debris from the lead side portion at the lead bending step can be suppressed, and deterioration in reliability of the semiconductor device due to such debris can be prevented. For example, a local dropout in an image signal due to debris adhered on a light receiving surface of a solid state imaging element and a dropout of a signal entering a recording surface due to debris adhered on a light emitting surface or reflection mirror surface of a light emitting element can be prevented. Further, such a problem can be prevented that debris adhered to and introduced via machines used in the production process adhere onto respective portions of the other semiconductor packages.

In the process of this embodiment, before the lead bending step, the semiconductor chip 11, such as a solid state imaging element, light-receiving/emitting element, LSI, or the like, is placed at the bottom of the cavity of the lower seal portion 13b, and a portion of the semiconductor chip 11 (electrode pad) is connected to the inner lead 12a by a metal wire 17 (wire bonding step). Thereafter, after the completion of the above-described lead bending step, the lid member 15 is fixed onto the upper surface of the upper seal portion 13a by an adhesive, whereby the semiconductor device shown in FIG. 1 is formed.

It should be noted that the lead bending step may be performed before the semiconductor chip 11 is mounted to the lower seal portion 13b, such that the semiconductor package shown in FIG. 4 is formed.

Alternatively, the lead bending step may be performed after the lid member 15 has been attached. Also in this case, if debris are scattered over the devices used in the production process, the debris can intrude before lid members are attached to the other semiconductor packages. In view of such, application of the present invention improves the reliability.

Figure 5A:
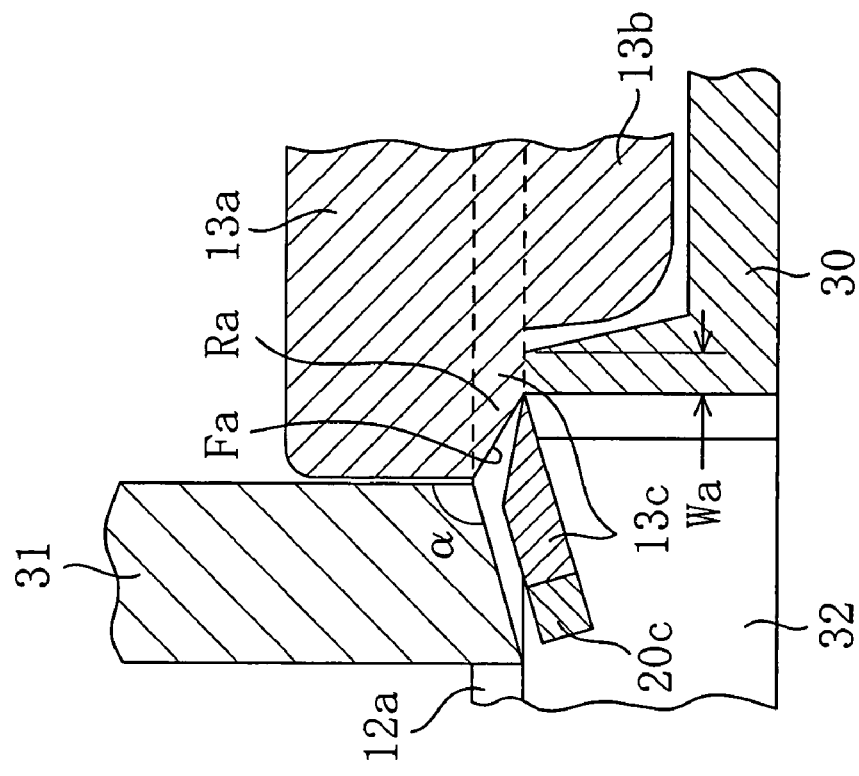
FIG. 5(a) and FIG. 5(b) are partial cross-sectional views respectively showing the structure of a pedestal and punch used in a conventional partial die cut step and the structure of a pedestal and punch used in a partial die cut step of embodiment 1.
Figure 5B:
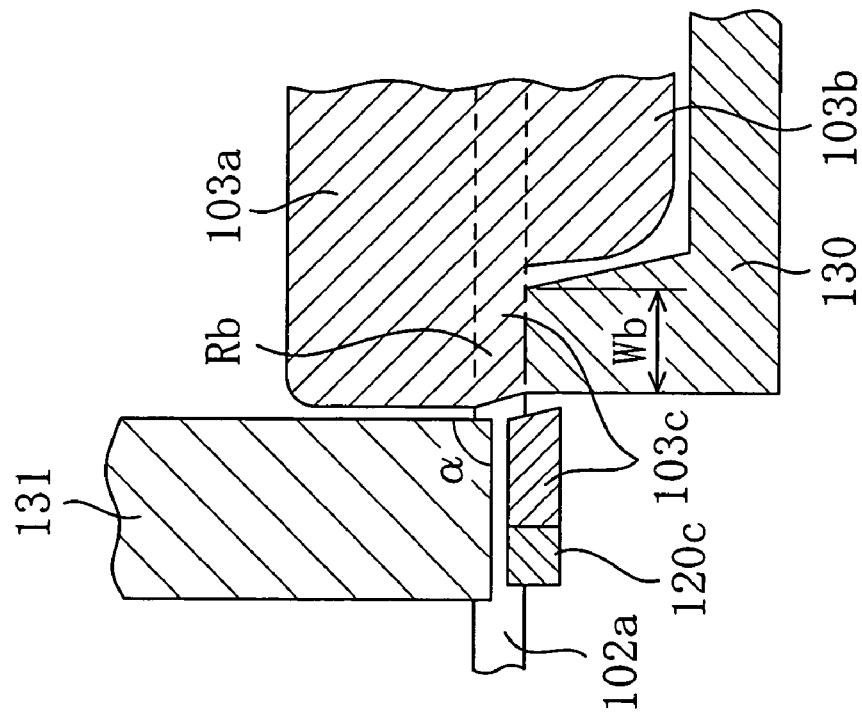

Comparison between Conventional Partial Die Cut and Partial Die Cut of this Embodiment FIG. 5(a) and FIG. 5(b) are partial cross-sectional views respectively showing the structure of a pedestal and punch used in a conventional partial die cut step and the structure of a pedestal and punch used in a partial die cut step of this embodiment.

As shown in FIG. 5(a), a pedestal 130 used in the conventional partial die cut step has a clearance generally required for a punch 131 in the partial die cut step but has an outer surface at a position generally near a side surface of the upper seal portion 103a and an inner surface at a position generally near a side surface of the lower seal portion 103b (die not shown). Therefore, the width of the upper surface of the pedestal 130, Wb, has a value near the overhang size of the upper seal portion 103a. In a partial die cut step in which such pedestal 130 and punch 131 are used, shear surfaces of the lead side portion 103c are formed substantially along the vertical direction. Thus, removed part of the lead side portion 103c is substantially the part of the lead side portion 103c extending outward beyond the upper seal portion 103a. As a result, almost all the tip region Rb of the lower seal portion 103b, which is right below the overhang portion of the upper seal portion 103a, remains as it is.

On the other hand, the pedestal 30 used in this embodiment has, as shown in FIG. 5(b), an outer surface at a site retreating from the side surface of the upper seal portion 13a and an inner side surface substantially near the side surface of the lower seal portion 13b. Therefore, the width of the upper surface of the pedestal 30, Wa, has a value much smaller than the overhang size of the upper seal portion 13a. In a partial die cut step in which such pedestal 30, punch 31 and die 32 are used, shear surfaces of the lead side portion 13c are formed in oblique directions between the lower end of the outer side surface of the upper seal portion 13a and the blade edge of the punch 31. Thus, the tip region Ra of the lead side portion 13c which is right below the overhang portion of the upper seal portion 13a has a slanted surface Fa1 which is slanted inwardly from top to bottom.

In this embodiment, as shown in FIG. 5(b), the punch 31 is used whose tip end surface is slanted from a direction perpendicular to the side surface and whose resin side blade edge angle α is greater than 90°. However, to achieve the basic effects of this invention, the punch may have a resin side blade edge angle of 90°. It should be noted that, by using a punch 31 whose resin side blade edge angle α is greater than 90°, the load applied simultaneously when the dam bar 20c and the lead side portion 13c are cut can be reduced.

FIG. 6(a) through FIG. 6(d) are, respectively, a partial cross-sectional view of a semiconductor package, a partial back view of the semiconductor package before lead bending, a partial perspective view of the semiconductor package after lead bending, and a partial back view of the semiconductor package after lead bending in the conventional production process. FIG. 6(e) through FIG. 6(h) are, respectively, a partial cross-sectional view of a semiconductor package, a partial back view of the semiconductor package before lead bending, a partial perspective view of the semiconductor package after lead bending, and a partial back view of the semiconductor package after lead bending in the production process of this embodiment.

Comparing the width of the lower surface Fb of the tip region Rb in the conventional production process shown in FIG. 6(a) and FIG. 6(b) and the width of the lower surface Fa2 of the tip region Ra in the production process of this embodiment shown in FIG. 6(e) and FIG. 6(f), it is seen that Fa2<Fb. As shown in FIG. 6(c) and FIG. 6(d), in the conventional production process, part of the tip region Rb is corrupted in the lead bending step, so that debris and a slanted surface Cb generated by corruption are shown. On the other hand, as shown in FIG. 6(g) and FIG. 6(h), in the production process of this embodiment, corruption of the tip region Ra does not occur even after the lead bending step, so that the slanted surface Fa1 and the lower surface Fa2 are the shear surfaces as formed in the partial die cut step.

Appropriate Range for Width B of Lower Surface Fa2 of Tip Region Ra

Figure 7:
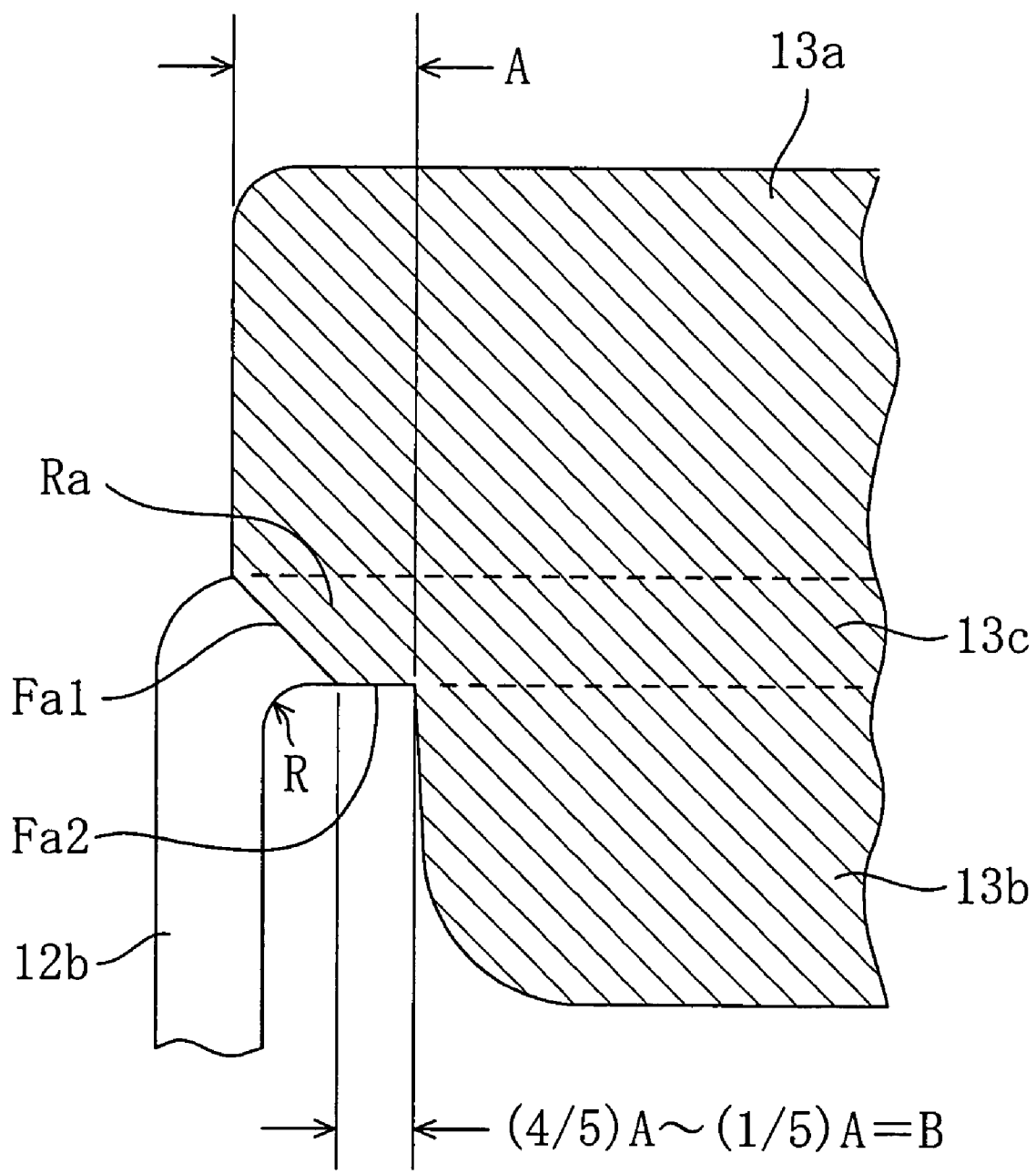
FIG. 7 is a partial cross-sectional view for illustrating an appropriate range of the width of the lower surface of the tip region of the lead side portion of the seal according to embodiment 1.

FIG. 7 is a partial cross-sectional view for illustrating an appropriate range of width B of the lower surface Fa2 of the tip region Ra. Hereinafter, the appropriate range of width B of the lower surface Fa2 of the tip region Ra shown in FIG. 5(b) is described with reference to FIG. 7.

To prevent generation of debris of resin, or the like, in the lead bending step, the tip portion of the lower surface Fa2 of the tip region Ra is placed inner than the bend starting position of the outer lead 12b. The radius of curvature of the inner curve of the outer lead 12b, R, is generally from 0.1 mm to 0.3 mm such that spring back is minimized. Depending on the thicknesses of the outer lead 12b, cracks can be generated in the outermost layers of the outer lead 12b by forcedly bending the outer lead 12b with a small radius of curvature. Such a size of width B of the lower surface Fa2 that debris are not generated in the lead bending step while the above defects are prevented is calculated.

As preconditions, the following assumptions are given.
Overhang size A: 0.4 mm
Thickness of lead: 0.15 mm to 0.25 mm
Radius of curvature of inner curve R: 0.1 mm to 0.3 mm With these preconditions, the appropriate range of width B is calculated.

1) The largest value of width B of the lower surface Fa2 of the tip region Ra is calculated with:
radius of curvature R: 0.1 mm, and
thickness of lead: 0.15 mm.

According to the design, the bend starting position of the lower surface Fa2 is inner than the overhang position by $2\pi R \cdot (1/8) = 0.0785$ mm.

Therefore, width B of the lower surface Fa2 is $B = 0.4 - 0.0785 = 0.3215$ mm.

2) The smallest value of width B of the lower surface Fa2 of the tip region Ra is calculated with:
radius of curvature R: 0.3 mm, and
thickness of lead: 0.25 mm.

According to the design, the bend starting position of the lower surface Fa2 is inner than the overhang position by $2\pi R \cdot (1/8) = 0.2355$ mm.

Therefore, width B of the lower surface Fa2 is $B = 0.4 - 0.2355 = 0.1645$ mm.

Considering the mold variation (process variation) of 0.05 mm in addition to this value, the smallest value of width B is 0.1145 mm.

From the above calculations, width B of the lower surface Fa2 of the tip region Ra is 80% at the largest and 28% at the smallest relative to the overhang size A. That is, the appropriate range of width B is $(1/5)A \leq B \leq (4/5)A$.

Measure for Preventing Breakage of Blade Edge of Pedestal, etc.

Where the smallest value of width B of the lower surface Fa2 of the tip region Ra is 0.1145 mm as described above, the blade edge width of the pedestal 30 shown in FIG. 5(b), Wa, needs to be about 0.1 mm. If blade edge width B of the pedestal 30 is as thin as 0.1 mm, the mechanical strength of the blade edge of the pedestal 30 deteriorates, so that there is a possibility that the blade edge breaks in the partial die cut step. As a matter of course, the load imposed upon the blade edge in the partial die cut step can be reduced by decreasing the cutting speed or by decreasing the number of dam bars and lead side portions die-cut at one time. In such a case, however, the production efficiency deteriorates, and accordingly, the production cost also deteriorates.

The measures for preventing breakage of the blade edge of the pedestal 30 while maintaining high production efficiency include reducing the load imposed when cutting by optimizing the resin side blade edge angle of the punch and strengthening the blade edge by optimizing the planar shape of the blade edge face of the pedestal.

1. Resin Side Blade Edge Angle of Punch

Where the resin side blade edge angle of the punch 31 is set to substantially 90°, the load is applied simultaneously over the whole tip surface of the punch 31 so that the cutting load is large. Therefore, when bending moment is applied to the pedestal 30 due to the large cutting load, there is a possibility of breakage of the pedestal 30.

On the other hand, in the case where the production method of this embodiment is used, the resin side blade edge angle a of the punch 31 is set greater than 90° such that the blade edge of the punch 31 sinks into the lead frame to gradually cut the lead frame, whereby the momentary contact area between the punch 31 and the lead frame can be decreased. As a result, the cutting load can be greatly reduced.

Figure 8:
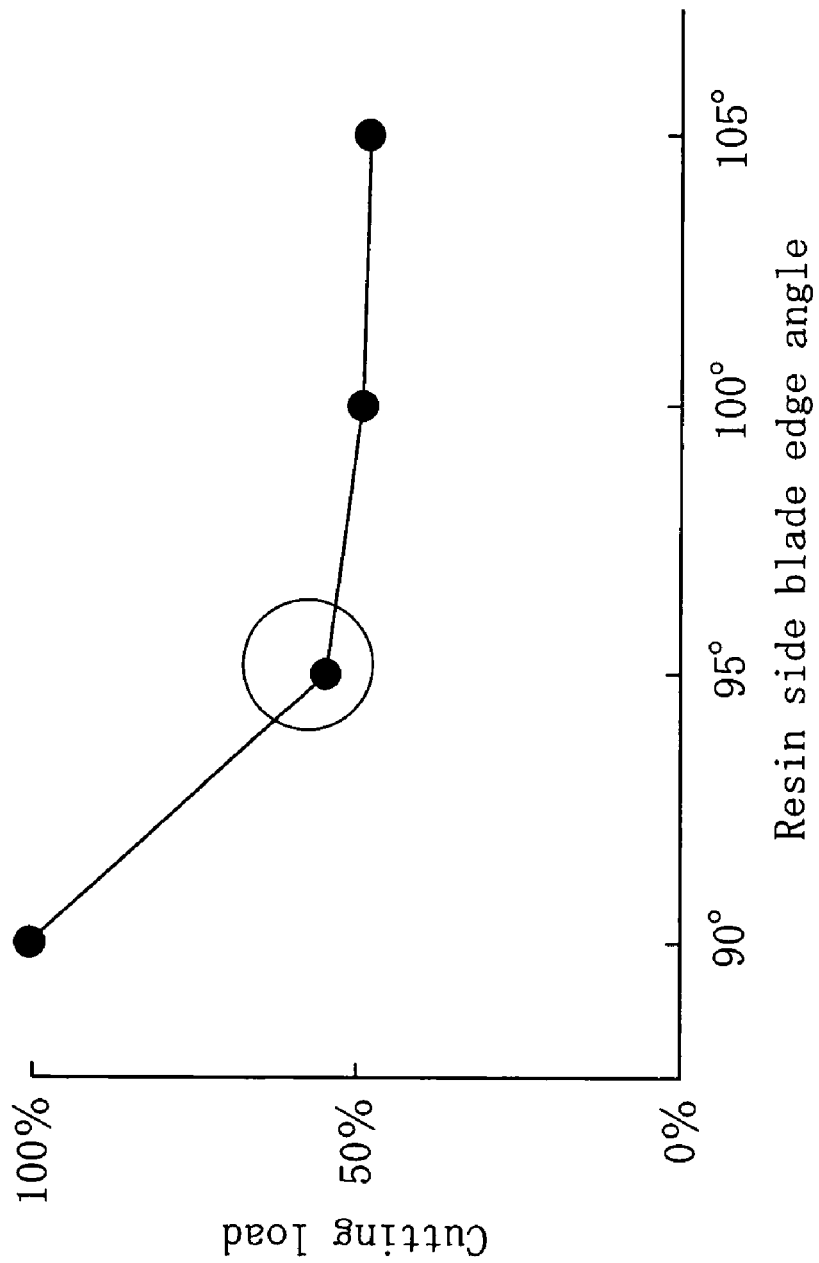
FIG. 8 illustrates the change in cutting load over the resin side blade edge angle of the punch of embodiment 1.

FIG. 8 illustrates the change in cutting load over the resin side blade edge angle of the punch. As shown in FIG. 8, when the resin side blade edge angle of the punch is 95° or greater, the load can be decreased. Although not shown in FIG. 8, it has been found that the effect of decreasing the cutting load is obtained in the range of 95° to 120°. Further, in consideration of mass production, when the resin side blade edge angle is in the range of 95° to 102°, a more preferable result was obtained, i.e., the yield was especially high.

Even when in the process the position of the punch 31 is varied by about 0.1 mm so that a small gap is generated between the punch 31 and the upper seal portion 13a, the effect of bending the dam bar 20c and the lead side portion 13c downward occurs as shown in FIG. 5(b) at the time when the blade edge of the punch 31 first comes in contact with the dam bar 20c, so that a shear surface is generated between the lower end of the outer surface of the upper seal portion 13a and the blade edge of the pedestal 30. Thus, unremoved portions, which can turn into debris in the future, can surely be prevented from remaining. As described in this embodiment, even when the gap between the blade edge of the pedestal 30 and the blade edge of the punch 31 is large, a stable shear surface can advantageously be formed between the blade edges when cutting.

The cutting load is halved in such a way, so that width Wa of the tip portion of the pedestal 30 can be a half of width Wb of the tip portion of the conventional pedestal 130.

2. Planar Shape of Blade Edge of Pedestal

Figure 9A:
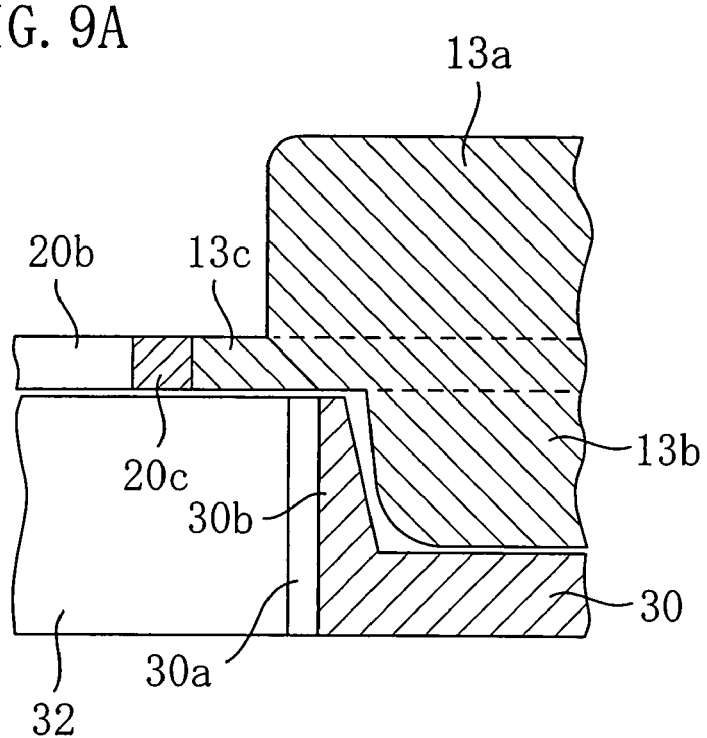
FIG. 9(a) and FIG. 9(b) are a partial cross-sectional view of a seal, die and pedestal and a plan view of the pedestal, respectively, for illustrating the relationship between the planar shape of the blade edge of the pedestal and the shape of the lead frame.
Figure 9B:
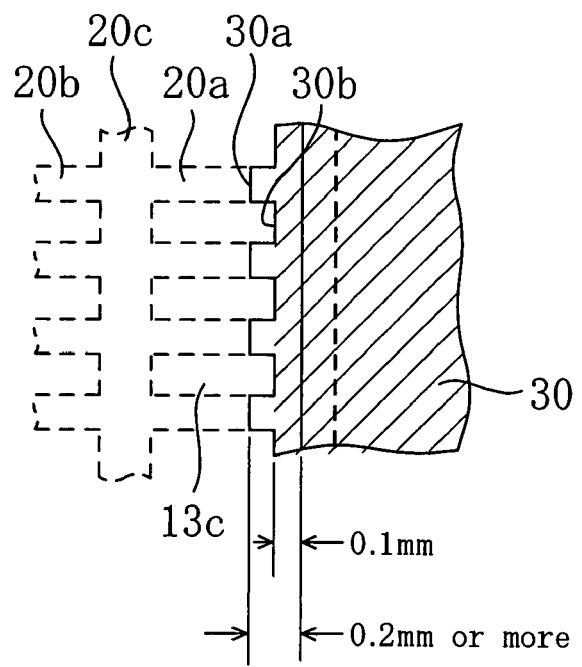

FIG. 9(a) and FIG. 9(b) are a partial cross-sectional view of a seal, die and pedestal and a plan view of the pedestal, respectively, for illustrating the relationship between the planar shape of the blade edge of the pedestal and the shape of the lead frame.

As shown in FIG. 9(b), the blade edge of the pedestal 30 has protrusions 30a in the regions in contact with the inner lead 20a of the lead frame and recesses 30b in the regions in contact with the lead side portion 13c. In other words, the blade edge of the pedestal 30 has a comb teeth-like planar shape. The blade edge width of the recess 30b is about 0.1 mm, and the blade edge width of the protrusion 30a is 0.2 mm or more. It should be noted that the outer surface of the protrusion 30a of the pedestal 30 is in contact with the outer surface of the die 32.

With such a structure, even when bending moment caused by the dam bar 20c and the lead side portion 13c acts on the blade edge of the pedestal 30, the strength of the pedestal 30 against the bending moment can be maintained at a high level. Therefore, the partial die cut step for preventing generation of debris is carried out with blade edge width Wa (the blade edge width of the recess 30b) shown in FIG. 5(a) set at 0.1 mm, while the strength of the pedestal 30 is secured, whereby breakage of the pedestal 30 in the partial die cut step can be prevented.

By employing this shape which is mass-producible, the pedestal 30 can be formed of a hard metal material having excellent abrasion resistance. The hard metal is hard and excellent in abrasion resistance but is, on the other hand, brittle and readily has chips by nature. When the hard metal material is applied to a portion on which mechanical load is imposed, it needs to be thick to some extent. Therefore, since the abrasion resistance is improved by employing the structure shown in FIG. 9(b), variation over time from the initial cut size is stabilized, and the life cycles of parts are extended.

Other Features

Figure 10A:
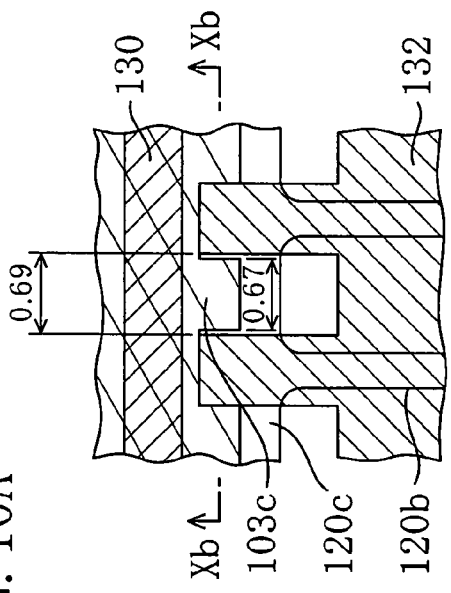
FIG. 10(a) and FIG. 10(b) are, respectively, a plan view illustrating the positional relationship between the pedestal and die and the seal which are used in the conventional partial die cut step, and a cross-sectional view taken along line Xb-Xb which illustrates the lead side portion falling.
Figure 10B:
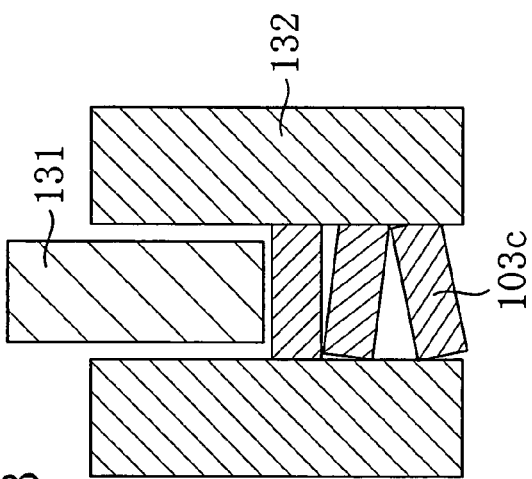

FIG. 10(a) and FIG. 10(b) are, respectively, a plan view illustrating the positional relationship between the pedestal and die and the seal which are used in the conventional partial die cut step, and a cross-sectional view taken along line Xb-Xb which illustrates falling of the lead side portion. FIG. 10(c) and FIG. 10(d) are, respectively, a plan view illustrating the positional relationship between the pedestal and die and the seal which are used in the partial die cut step of this embodiment, and a cross-sectional view taken along line Xd-Xd which illustrates falling of the lead side portion.

As shown in FIG. 10(a) and FIG. 10(b), the space between the blade edge portions of the conventionally-employed die 132 supporting the outer lead 120b and dam bar 120c is about 0.69 mm, while the width of the punch 131 is 0.67 mm. Therefore, in the case of such a structure of the die 132, the lead side portion 103c readily gets snagged in a space of the die 132, so that there is a possibility that free-fall of the lead side portion 103c does not smoothly occur.

On the other hand, as shown in FIG. 10(c), the width of the die 32 of this embodiment is reduced from 0.60 mm to 0.54 mm under the lead side portion 13c. In the die 32 of this embodiment, the space between the blade edge portions of the die 32 supporting the outer lead 20b and dam bar 20c is about 0.73 mm at a wider position, and the width of the punch 31 is 0.69 mm. Thus, as shown in FIG. 10(d), in the case of the structure of the die 32 of this embodiment, the lead side portion 13c rarely gets snagged in a space of the die 32, so that free-fall of the lead side portion 13c smoothly occurs.

Further, generation of flash of resin, or the like, can be prevented in the vicinity of a portion from which the lead side portion 13c has fallen.

Embodiment 2

Descriptions in this embodiment are directed not to a contrivance for removing a lead side portion in the partial die cut step but to countermeasures against debris with a contrivance in the structure of a mold die in the mold process.

Figure 11A:
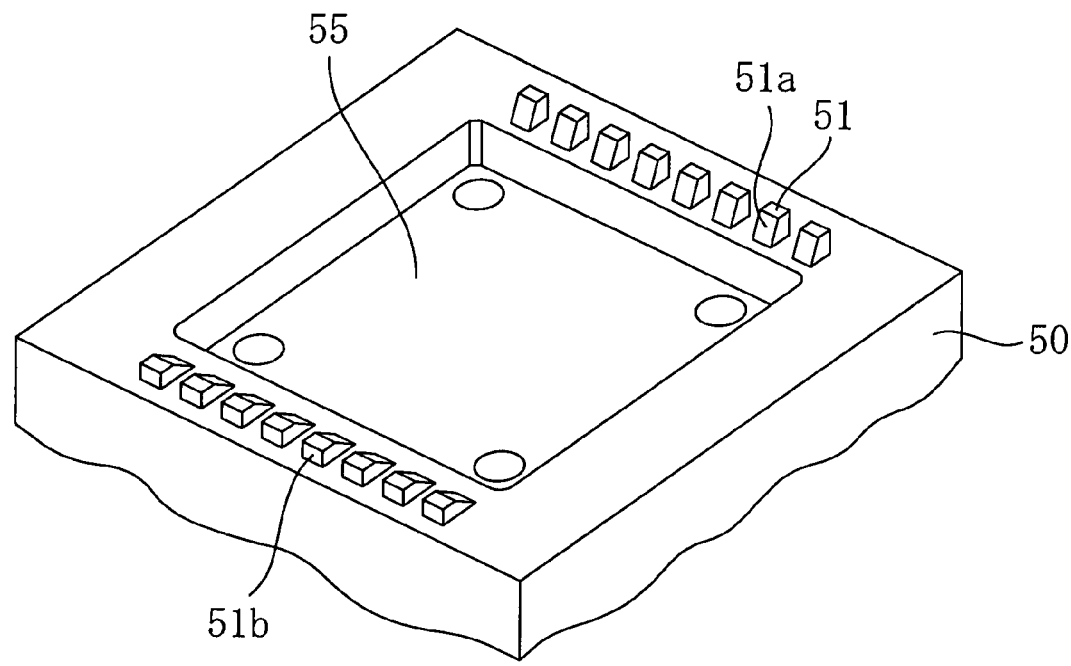
FIG. 11(a) and FIG. 11(b) are, respectively, a perspective view and plan view showing only the structure near a die cavity of the lower die half of a mold die of embodiment 2.
Figure 11B:
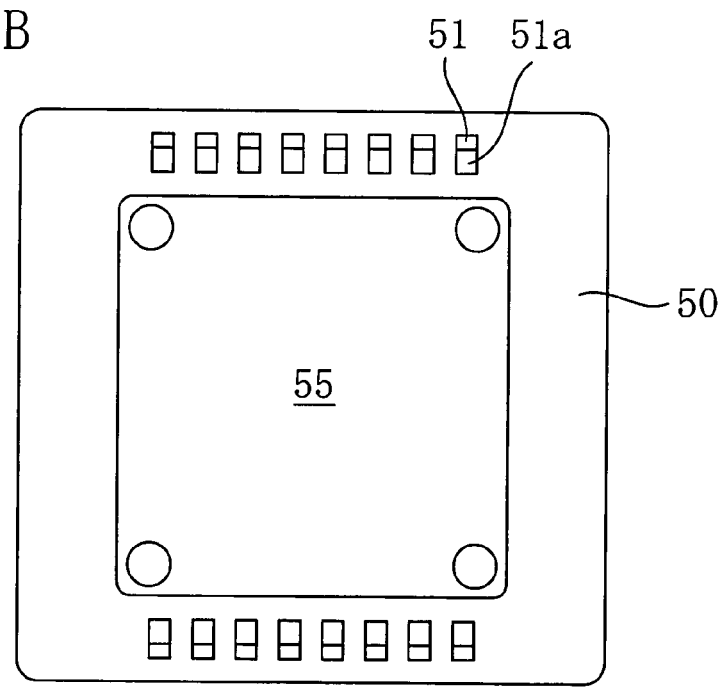

FIG. 11(a) and FIG. 11(b) are, respectively, a perspective view and plan view showing only the structure near a die cavity of the lower die half of a mold die of embodiment 2.

As shown in FIG. 11(a) and FIG. 11(b), dam blocks 51 for filling regions surrounded by inner leads and dam bars of the lead frame are provided on a side of a die cavity 55 of the lower die half 50 of the mold die. The inner surface 51a of the dam block 51 is sloped according to the slanted surface Fa of the tip region Ra of the lower seal portion 13b described in embodiment 1.

Figure 12A:
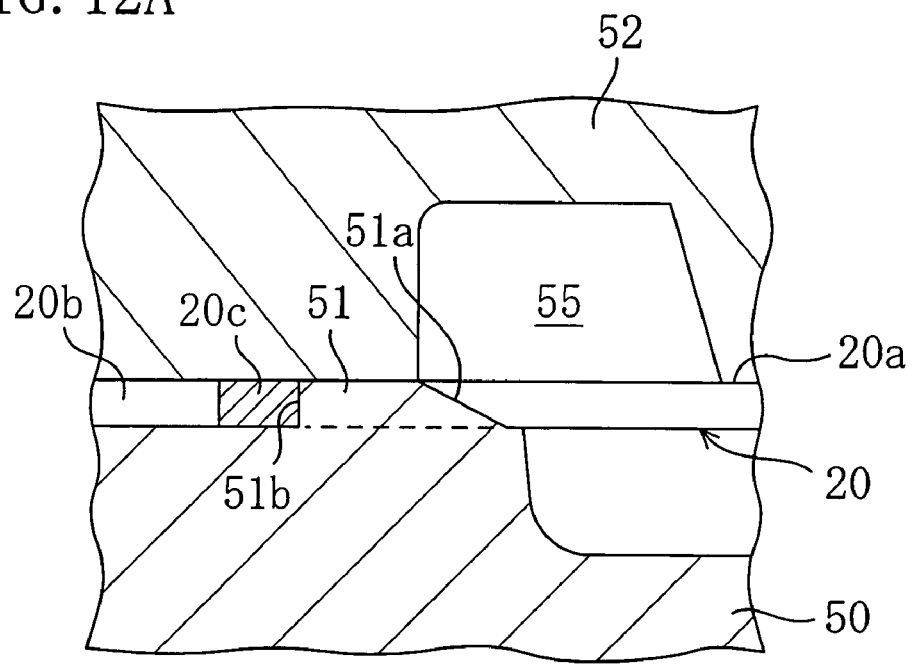
FIG. 12(a) and FIG. 12(b) are, respectively, a partial cross-sectional view illustrating the positional relationship between the mold die and the lead frame in the mold step of embodiment 2, and a partial cross-sectional view illustrating the structure of a seal immediately after the end of the mold step.
Figure 12B:
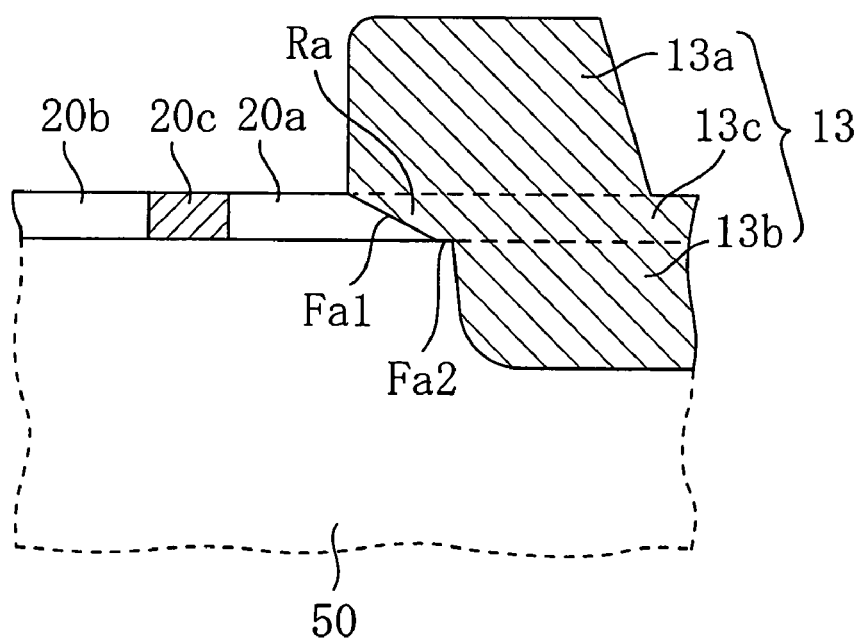
Figure 13:
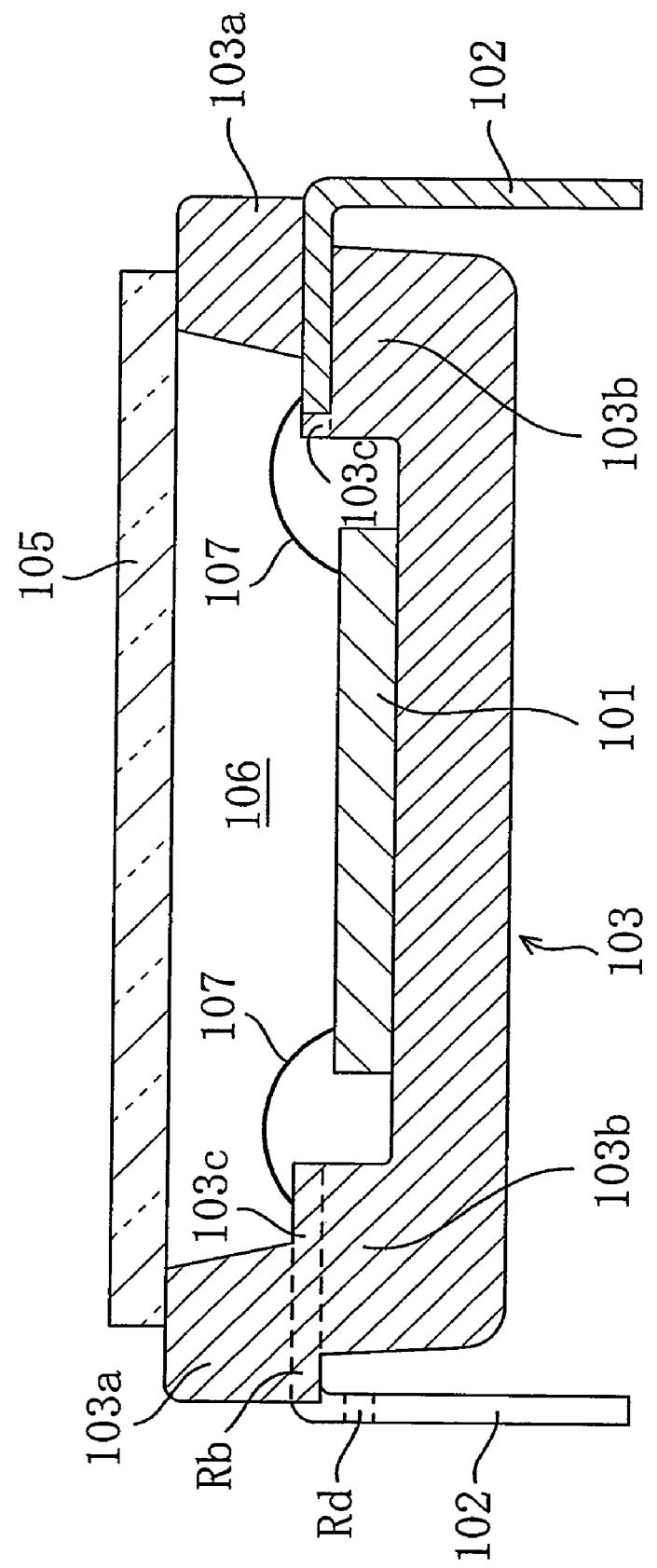
FIG. 13 is a cross-sectional view showing the structure of an optical device which includes a semiconductor package having a conventional overhang structure.

FIG. 12(a) and FIG. 12(b) are, respectively, a partial cross-sectional view illustrating the positional relationship between the mold die and the lead frame in the mold step, and a partial cross-sectional view illustrating the structure of a seal immediately after the end of the mold step.

As shown in FIG. 12(a), molding of a resin or ceramic is carried out with the lead frame 20 sandwiched between the lower die half 50 and the upper die half 52 such that the outer surface 51b of the dam block 51 of the lower die half 50 is in contact with the dam bar 20c of the lead frame and that the upper end of the inner surface 51a of the dam block 51 is substantially coincident with the lower end of the inner surface of the upper die half 52.

In this embodiment, the shape of the dam block 51 of the lower die half 50 is determined such that the dimension in the width direction is narrower than the dimension between leads by 0.06 mm or more. The length of the upper surface of the dam block 51 is smaller by 0.06 mm (i.e., −0.06 mm) than the dimension between the outer surface of the upper seal portion 13a and the inner surface of the dam bar 20c shown in FIG. 11(b). The length of the lower surface of the dam block 51 is equal to the dimension between the inner surface of the dam bar 20c and an inner position by a ⅘ of the overhang size of the upper seal portion 13a. The set value for the height of the dam block 51 is a minus tolerance value of the thickness of the lead frame 20.

As shown in FIG. 12(b), after the end of the molding step, the tip region Ra of the lower seal portion 13b of the seal 13 has the slanted surface Fa1 corresponding to the inner surface 51a of the dam block 51 and the flat lower surface Fa2 corresponding to a portion which is to be received by the blade edge of the pedestal in embodiment 1. Namely, the same structure as that obtained when the lead side portion is removed through the partial die cut step of embodiment 1 is obtained.

In this embodiment, as for the structure of the seal, the same structure as that obtained when the lead side portion is removed through the partial die cut step of embodiment 1 is obtained. Therefore, defects due to debris of resin or ceramic can be prevented.

In the partial die cut step, the cut thickness of resin or ceramic can be thin. Therefore, the life of the blade edge of the pedestal can be extended. Further, the load imposed on the blade edge in the partial die cut step can be reduced, so that generation of package chips can be suppressed.

Although in the above embodiments such a type of device that the seal has the shape of a container having an interior space has been described, the present invention is also applicable to such a type of semiconductor device that there is no interior space and the spaces around a semiconductor chip and metal wires are filled with a mold material. Also in such a case, there is a possibility that various defects are caused in the production process of the semiconductor device by debris adhered to and introduced via machines used in the production process, but application of the present invention can reduce such defects.

INDUSTRIAL APPLICABILITY

A semiconductor package, production method thereof, and semiconductor device of the present invention are applicable to a semiconductor device including a solid state imaging element, light receiving/emitting element, and LSI, such as a memory, logic, or the like, or production method thereof.

The invention claimed is:

1. A semiconductor package comprising a plurality of leads for transmission/reception of a signal between a semiconductor chip and an external device and a seal for sealing at least part of the plurality of leads, wherein:
part of the seal which surrounds each of the leads includes
a lower seal portion present under a lower surface of the lead,
an upper seal portion present over an upper surface of the lead, part of the upper seal portion overhanging outward beyond the lower seal portion, and
a lead side portion present between the lower seal portion and the upper seal portion, the lead side portion filling a gap between the leads;
each of the leads has an outer lead protruding out of the seal and an inner lead buried in the seal; and
an outer surface of the lead side portion which exists right below the part of the upper seal portion overhanging outward beyond the lower seal portion is slanted inwardly along a downward direction from a lowermost part of an outer surface of the upper seal portion.

2. The semiconductor package of claim 1, wherein the width of a tip region of the lead side portion protruding from the lower seal portion is in the range of a ⅕ to ⅘ of an overhang size of the upper seal portion.

3. A semiconductor package comprising a plurality of leads for transmission/reception of a signal between a semiconductor chip and an external device and a seal for sealing at least part of the plurality of leads, wherein:
part of the seal which surrounds each of the leads includes
a lower seal portion present under a lower surface of the lead,
an upper seal portion present over an upper surface of the lead, part of the upper seal portion overhanging outward beyond the lower seal portion, and
a lead side portion present between the lower seal portion and the upper seal portion, the lead side portion filling a gap between the leads;
each of the leads has an outer lead protruding out of the seal and an inner lead buried in the seal;
an outer surface of the lead side portion which exists right below the part of the upper seal portion overhanging outward beyond the lower seal portion is slanted inwardly along a downward direction from a lowermost part of an outer surface of the upper seal portion; and
a tip region of the lead side portion protruding from the lower seal portion is not in contact with a portion of the outer lead which is to be bent.

4. A semiconductor device comprising a semiconductor chip, a plurality of leads for transmission/reception of a signal between the semiconductor chip and an external device, a connection member for electrically connecting part of the semiconductor device with each of the leads, and a seal for sealing at least part of the plurality of leads, wherein:
part of the seal which surrounds each of the leads includes
a lower seal portion present under a lower surface of the lead,
an upper seal portion present over an upper surface of the lead, part of the upper seal portion overhanging outward beyond the lower seal portion, and
a lead side portion present between the lower seal portion and the upper seal portion, the lead side portion filling a gap between the leads;
each of the leads has an outer lead protruding out of the seal and having a bent distal end and an inner lead buried in the seal;
an outer surface of the lead side portion which exists right below the part of the upper seal portion overhanging outward beyond the lower seal portion is slanted inwardly along a downward direction from a lowermost part of an outer surface of the upper seal portion.

5. The semiconductor device of claim 4, wherein the width of a tip region of the lead side portion protruding from the lower seal portion is in the range of a ⅕ to ⅘ of an overhang size of the upper seal portion.

6. A semiconductor device comprising a semiconductor chip, a plurality of leads for transmission/reception of a signal between the semiconductor chip and an external device, a connection member for electrically connecting part of the semiconductor device with each of the leads, and a seal for sealing at least part of the plurality of leads, wherein:
part of the seal which surrounds each of the leads includes
a lower seal portion present under a lower surface of the lead,
an upper seal portion present over an upper surface of the lead, part of the upper seal portion overhanging outward beyond the lower seal portion, and
a lead side portion present between the lower seal portion and the upper seal portion, the lead side portion filling a gap between the leads;
each of the leads has an outer lead protruding out of the seal and having a bent distal end and an inner lead buried in the seal;
an outer surface of the lead side portion which exists right below the part of the upper seal portion overhanging outward beyond the lower seal portion is slanted inwardly along a downward direction from a lowermost part of an outer surface of the upper seal portion; and
a tip region of the lead side portion protruding from the lower seal portion is not in contact with the bent portion of the outer lead.

* * * * *